(12) United States Patent
Priefert et al.

(10) Patent No.: US 11,923,839 B2
(45) Date of Patent: Mar. 5, 2024

(54) GATE DRIVER DEVICE

(71) Applicant: Infineon Technologies Austria AG, Villach (AT)

(72) Inventors: Dirk Priefert, Moers (DE); Matteo Albertini, Pavia (IT); Remigiusz Viktor Boguszewicz, Essen (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 17/874,946

(22) Filed: Jul. 27, 2022

(65) Prior Publication Data

US 2023/0039922 A1  Feb. 9, 2023

(30) Foreign Application Priority Data

Aug. 3, 2021  (EP) ..................... 21189374

(51) Int. Cl.
*H03K 17/687* (2006.01)
*H01L 21/762* (2006.01)
*H03K 17/06* (2006.01)

(52) U.S. Cl.
CPC ....... *H03K 17/6872* (2013.01); *H01L 21/762* (2013.01); *H03K 17/063* (2013.01); *H03K 2217/0018* (2013.01)

(58) Field of Classification Search
CPC ............. H03K 17/6872; H03K 17/063; H03K 2217/0018; H03K 17/122; H01L 21/762; H01L 27/1203; H01L 29/78648; H01L 29/78654
See application file for complete search history.

(56) References Cited

U.S. PATENT DOCUMENTS

| 6,052,019 | A | 4/2000 | Kwong | |
|---|---|---|---|---|
| 6,400,209 | B1 * | 6/2002 | Matsuyama | .......... H02J 7/0031 327/434 |

FOREIGN PATENT DOCUMENTS

| EP | 1246362 | A2 | 10/2002 |
|---|---|---|---|
| EP | 3787164 | A1 | 3/2021 |

* cited by examiner

*Primary Examiner* — Jung Kim
(74) *Attorney, Agent, or Firm* — Murphy, Bilak & Homiller, PLLC

(57) ABSTRACT

A gate driver device includes a first field effect transistor and a first driver circuit. The first field effect transistor includes a first gate electrode and a first backgate structure. The first driver circuit supplies a first backgate drive signal to the first backgate structure.

18 Claims, 9 Drawing Sheets

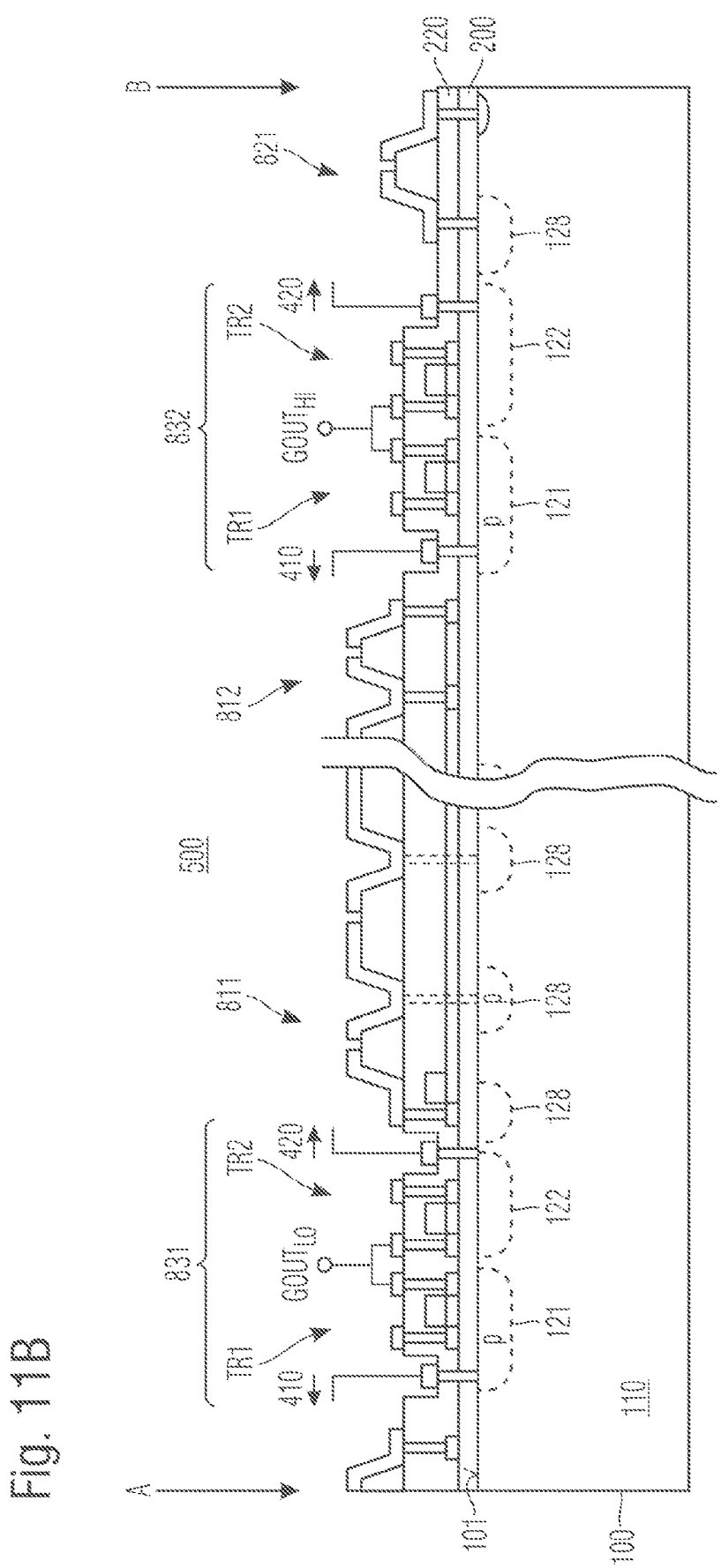

GATE DRIVER DEVICE

TECHNICAL FIELD

Examples of the present disclosure relate to a gate driver device with a backgate structure. In particular, the gate driver device may be an SOI (silicon-on-insulator) gate driver circuit.

BACKGROUND

Gate driver circuits enable a micro-controller or digital signal processor (DSP) to efficiently turn on and turn off power semiconductor switches such as IGBTs (insulated gate bipolar transistor) or MOSFETs (metal oxide semiconductor field effect transistor) in power conversion circuits and motor control application. A buffer stage including output transistors with low-level inputs drives the comparatively high input current needed for the gate of the power semiconductor switch. A level-shifter with a bootstrap diode may shift the reference potential of a buffer stage that drives the gate voltage for the high-side switch in a half-bridge. In gate drivers based on SOI (semiconductor-on-insulator) technology, each output transistor of each buffer stage may be formed in a thin semiconductor film with dielectric isolation to all sides. In such case, no latch-up is possible because of the dielectric isolation to all sides of the current path. In addition, the leakage current is also very low.

The continuing demand for decreasing manufacturing costs is driving the trend towards smaller gate driver circuits.

SUMMARY

Embodiments of the present disclosure enable gate driver devices with higher output current per unit area.

To this purpose, an embodiment of the present disclosure relates to a gate driver device. The gate driver device includes a first field effect transistor and a first driver circuit. The first field effect transistor includes a first gate electrode and a first backgate structure. The first driver circuit supplies a first backgate drive signal to the first backgate structure.

Another embodiment of the present disclosure relates to a gate driver device with a semiconductor substrate that includes a bulk portion and a first well, wherein a conductivity type of the first well is opposite to a conductivity type of the bulk portion. The gate driver device further includes a first semiconductor layer including doped regions of a first field effect transistor. A dielectric layer is between the semiconductor substrate and the first semiconductor layer, wherein the first well and at least a portion of the first semiconductor layer are directly opposite each other. A first driver circuit is configured to supply a first backgate drive signal to the first well.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of the embodiments and are incorporated in and constitute a part of this specification. The drawings illustrate embodiments of a gate driver device and together with the description serve to explain principles of the embodiments. Further embodiments are described in the following detailed description and the claims. Features of the various illustrated embodiments may be combined with each other.

FIGS. 11A and 11B show a simplified plan view and a corresponding simplified vertical cross-sectional view of a gate driver device with a first buffer stage for a half-bridge low-side switch and with a second buffer stage for a half-bridge high-side switch according to a further embodiment.

DETAILED DESCRIPTION

Figure 1:
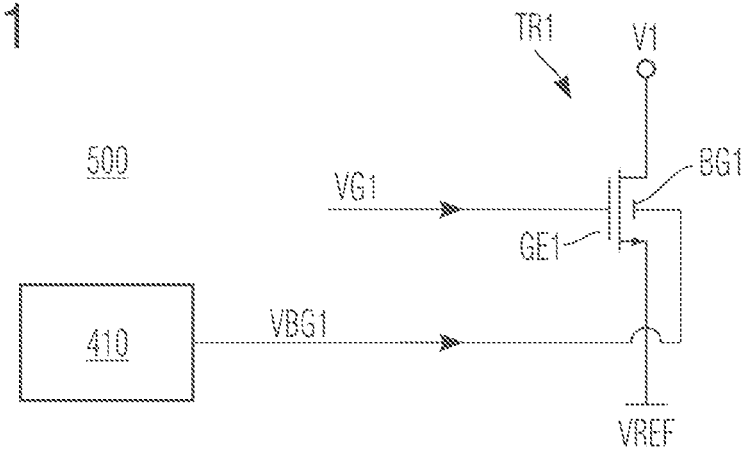
FIG. 1 is a schematic circuit diagram of a gate driver device with a field effect transistor and a driver circuit supplying a backgate drive signal to a backgate structure according to an embodiment.

In the following detailed description, reference is made to the accompanying drawings, which form a part hereof and in which are shown by way of illustrations specific embodiments in which a gate driver device may be practiced. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" describes a permanent low-resistive ohmic connection between electrically connected elements, for example a direct contact between the concerned elements or a low-resistive connection via a metal and/or heavily doped semiconductor material.

An "ohmic contact" is a non-rectifying electrical junction with a linear or almost linear current-voltage characteristic.

Ranges given for physical dimensions include the boundary values. For example, a range for a parameter y from a to b reads as a≤y≤b. The same holds for ranges with one boundary value like "at most" and "at least".

The term "on" is not to be construed as meaning only "directly on". Rather, if one element is positioned "on" another element (e.g., a layer is "on" another layer or "on" a substrate), a further component (e.g., a further layer) may be positioned between the two elements (e.g., a further layer may be positioned between a layer and a substrate if the layer is "on" said substrate).

A gate driver device may include a first field effect transistor and a first driver circuit. The first field effect transistor includes a first gate electrode and a first backgate structure. The first driver circuit supplies a first backgate drive signal to the first backgate structure.

The gate driver device accepts a low-power input signal from a controller IC and outputs one or two high-current drive signals for the gates of power semiconductor switches such as IGBTs or power MOSFETs.

The first field effect transistor may be part of a buffer stage that generates a high-current drive signal with a dynamic output current of several mA, e.g. at least 1 mA, at least 10 mA or at least 50 mA and up to several A, e.g. 2 A. The first field effect transistor may be, for example, the push part or the pull part of a push-pull amplifier or the low-side switch or the high-side switch of an inverter stage.

The first gate electrode is a conductive structure capacitively coupled to a body region of the first field effect transistor. An electric potential applied to the first gate electrode controls a current flow through the first field effect transistor by field effect.

The first backgate structure may be any conductive structure that is spatially separated from the gate electrode and that affects the charge carrier flow in an on state of the first field effect transistor by its electric potential. In particular, the backgate structure may be a doped semiconductor region separated from the active doped regions of the first field effect transistor by a dielectric structure different from the gate dielectric.

The first driver circuit may supply the first backgate drive signal as a signal that changes between at least two voltage levels. In particular, the first backgate drive signal may be a square-wave signal changing between an active voltage level and an inactive voltage level, wherein the first driver circuit supplies and sinks the required current to drive the different voltage levels.

A suitable active voltage level applied to the backgate structure may lower the electrical on-state resistance RDSon of the first field effect transistor. For example, an appropriate voltage level applied to the backgate structure may lower a channel resistance and/or a resistance of a lightly doped drift region of the first field effect transistor, thereby increasing the current-carrying capability per unit area, and enabling a smaller chip area and/or higher output currents.

The first driver circuit allows the active voltage level to be selectively applied to the backgate structure only when the first field effect transistor is on. The inactive voltage level may be applied to the backgate structure otherwise, thereby avoiding adverse effects on leakage current and/or voltage blocking capability.

According to an embodiment, the first driver circuit may further be configured to supply a first gate signal to the first gate electrode.

The first driver circuit may obtain the first backgate drive signal directly from the first gate signal or may obtain the first gate signal directly from the first backgate drive signal. A single driver circuit output provides both the first gate signal and the first backgate drive signal. The first backgate drive signal can be easily branched from the first gate signal. Implementation of the backgate control requires only minor additional effort.

According to another embodiment, the gate driver device may further include a first gate signal driver circuit that supplies a first gate signal to the first gate electrode, wherein level changes of the first backgate drive signal and the first gate signal are in fixed temporal relation.

For example, the level changes of the first backgate drive signal and the level changes of the first gate signal may be synchronous or at least approximately synchronous. In particular, the signal levels of the first gate signal and the first backgate drive signal may change simultaneously or approximately simultaneously. Alternatively, the level changes of the first backgate drive signal may be slightly delayed with respect to the level changes of the first gate signal by a constant time offset. Alternatively, the level changes of the first gate signal may be slightly delayed with respect to the level changes of the first backgate drive signal by a constant time offset. Time-shifted control of the first gate signal and the first backgate signal may improve switching behavior, in particular when the backgate is switched on prior to the gate.

According to another embodiment, the first driver circuit and the first gate driver circuit may receive a common input signal and generate level changes of the first gate signal and the first backgate drive signal in fixed time relation to level changes of the common input signal.

In this case, the first driver circuit and the first gate driver circuit are different, independent circuits that are synchronized through the common input signal and can otherwise be controlled independently from each other.

According to an embodiment, the gate driver device may further include a second field effect transistor and a second driver circuit. The second field effect transistor includes a second gate electrode and a second backgate structure. The second driver circuit supplies a second backgate drive signal to the second backgate structure.

The first and second field effect transistors may have matching transistor parameters. For example, the first and second field effect transistors may have the same or approximately the same saturation current and the same voltage blocking capability.

The second driver circuit may have substantially the same configuration as the first driver circuit. For example, the second driver circuit may provide a second gate signal to the second gate electrode, wherein the second driver circuit may obtain the second backgate drive signal directly from the second gate signal or may obtain the second gate signal directly from the second backgate drive signal. A single driver circuit output may provide both the second gate signal and the second backgate drive signal. The second backgate drive signal can be easily branched off from the second gate signal.

The first field effect transistor and the second field effect transistor may be complementary parts of a push-pull amplifier or of an inverter stage. In particular, the first field effect transistor may be turned on after the second field effect transistor is turned off and the second field effect transistor may be turned on after the first field effect transistor is turned off.

According to an embodiment, the gate driver device may include a second gate signal driver circuit that supplies a second gate signal to the second gate electrode, wherein level changes of the second backgate drive signal and the second gate signal are in fixed temporal relation.

For example, the second gate signal driver circuit may obtain the second backgate drive signal from the second gate signal or vice versa. The second driver circuit and the second gate signal driver circuit may receive a common input signal and generate level changes of the second gate signal and the second backgate drive signal in fixed time relation to level changes of the common input signal, such that the second gate signal driver circuit and the second driver circuit are synchronized by the common input signal. Apart from the common input signal, the second gate signal driver circuit and the second driver circuit can operate independently of each other.

The first field effect transistor and the second field effect transistor may have the same channel type. For example, the first field effect transistor and the second field effect transistor may be n-channel FETs (nFETs). Alternatively, the first field effect transistor and the second field effect transistor may be p-channel FETs (pFETs).

According to an embodiment, the first field effect transistor and the second field effect transistor may have complementary channel types. For example, the first field effect transistor is an nFET and the second field effect transistor is a pFET. Alternatively, the first field effect transistor is a pFET and the second field effect transistor is an nFET.

Source-drain paths of the first and second field effect transistors may be electrically connected in series between a positive supply voltage and a supply voltage reference. A network node connecting the load paths of the first and second field effect transistors may be connected to a gate output terminal of the gate driver device through a low-impedance path such as a metal line.

According to an embodiment, the first backgate structure may include a first well formed in a semiconductor substrate, wherein a conductivity type of the first well is opposite to a conductivity type of a bulk portion of the semiconductor substrate. The doped regions of the first field effect transistor are formed in a first semiconductor layer. A dielectric layer is formed between the semiconductor substrate and the first semiconductor layer. The first driver circuit supplies the first backgate drive signal to the first well.

The on-state current of the first field effect transistor is modulated by the voltage at the first well. An active voltage level of the first backgate drive signal may be in the order of magnitude of the active voltage level of the first gate signal. For example, the first gate signal and the first backgate drive signal may have the same active voltage level. In addition, the first gate signal and the inactive first backgate drive signal may have the same inactive voltage level.

According to another embodiment a gate driver circuit may include a semiconductor substrate, a first semiconductor layer, a dielectric layer and a first driver circuit.

The semiconductor substrate may include a bulk portion and a first well, wherein a conductivity type of the first well is opposite to a conductivity type of the bulk portion. The first semiconductor layer includes doped regions of a first field effect transistor. The dielectric layer is between the semiconductor substrate and the first semiconductor layer, wherein the first well and at least a portion of the first semiconductor layer are directly opposite each other. The first driver circuit supplies a first backgate drive signal to the first well.

In particular, the semiconductor substrate may be formed of a single crystalline semiconductor material such as silicon. The semiconductor substrate may have two substantially parallel main surfaces, which may have approximately the same shape and size. The semiconductor substrate has a surface extent along two orthogonal axes (x-axis and y-axis) defining horizontal directions, and a thickness along a z-axis defining a vertical direction perpendicular to the horizontal directions. In the following, the horizontal directions are also referred to as lateral directions and the main surface on the front side is referred to as the first surface.

The first well may extend from the first surface into the semiconductor substrate. The first well and the bulk portion form a pn junction. In addition to the first well, further doped regions of any conductivity type may extend from the first surface into the semiconductor substrate. The first well is separated from other wells associated with other transistors, diodes and termination regions of the gate driver device.

The first semiconductor layer may be a layer of uniform thickness. The thickness of the first semiconductor layer along the vertical direction may be in a range from 50 nm to 200 nm, e.g. approximately 100 nm. The doped regions of the first field effect transistor may include a source region, a body region, a drift region, and a drain region. The source region, the body region, the drift region and the drain region may be formed side-by-side in this order along one of the horizontal directions, e.g., along the x-axis or along the y-axis. The body region laterally separates the source region and the drift region. The drift region laterally separates the body region and the drain region. Along the vertical direction, each of the source region, the body region, the drift region and the drain region extends from the top of the first semiconductor layer down to the bottom of the first semiconductor layer. The source region, the drain zone and the drift region may have a first conductivity type. The body region may have the complementary second conductivity type.

A gate dielectric formed at the front side of the first semiconductor layer separates the body region from a gate electrode of the first field effect transistor.

The dielectric layer separates the first semiconductor layer and the semiconductor substrate. The dielectric layer has a uniform vertical extension. The dielectric layer may be a homogenous layer, e.g. a silicon oxide layer. Alternatively, the dielectric layer may include two or more vertically stacked sub-layers of different composition and/or structure. The dielectric layer and the gate dielectric differ in at least one of material, composition and thickness. In particular, a capacitive coupling between gate electrode and first semiconductor layer is greater than a capacitive coupling between the first semiconductor layer and the semiconductor substrate.

The first driver circuit may be formed in a further semiconductor layer vertically separated from the semiconductor substrate and laterally separated from the first semiconductor layer.

The first backgate drive signal may change between at least two voltage levels. For example, the first backgate drive signal may be a square-wave signal changing between an active voltage level and an inactive voltage level, wherein the first driver circuit supplies and sinks current to drive the different signal levels.

In case the first field effect transistor is an nFET, the active voltage level may be a positive voltage, in particular in the order of magnitude of the active nFET gate voltage level, i.e. about +10V. The inactive voltage level may be 0V or a negative voltage.

In case the first field effect transistor is a pFET, the active voltage level may be a negative voltage, in particular in the order of magnitude of the active pFET gate voltage level, i.e. about −10V. The inactive voltage level may be 0V or a positive voltage.

A suitable voltage level applied to the first well may lower the electrical on-state resistance of the first field effect transistor. For example, an appropriate active voltage level applied to the first well lowers a channel resistance and/or the resistance of the lightly doped drift region of the first field effect transistor, thereby increasing the current-carrying capability per unit area, and enabling a smaller chip area and/or higher output currents in the on state. The first driver circuit allows the active voltage level to be selectively applied when the first field effect transistor is on. The inactive voltage level may be applied when first field effect transistor is off, thereby avoiding adverse effects on leakage current and/or voltage blocking capability.

In addition, the first well may be used to reduce the gate-to-source capacitance. Reducing the gate-to-source capacitance may further contribute to reduce chip area.

According to an embodiment, the first semiconductor layer may include a drift region of the first field effect transistor, wherein the first well and at least a portion of the drift region are directly opposite each other.

The first well and the drift region extend along opposite sides of the dielectric structure with the first well overlapping with at least a portion of the drift region in the lateral direction. In particular, a vertical projection of the first well into the first semiconductor layer overlaps with at least the portion of the drift region oriented to the drain region. For example, the entire drift region of the first field effect transistor may be directly opposite the first well.

The first well may be absent opposite the body region. Alternatively, the first well may be formed directly opposite the entire drift region and a directly adjoining portion of the body region. For example, the first well may be directly opposite the entire drift region and the entire body region. According to another example, the first well may be formed such that the entire first semiconductor layer—separated by the dielectric structure—is directly above the first well. In particular, a vertical projection of the horizontal contour of the first well into the plane of the first semiconductor layer completely surrounds the first semiconductor layer.

The first well may laterally extend to some degree beyond an outer circumference of the first field effect transistor and the first semiconductor layer but may be absent below other transistors and diodes of the gate driver device. In particular, the first well is laterally separated from other wells associated with other transistors, diodes and voltage termination regions.

According to an embodiment, the gate driver device may include a second well formed in the semiconductor substrate, wherein a conductivity type of the second well is opposite to a conductivity type of the bulk portion. The gate driver device may also include a second semiconductor layer that includes doped regions of a second field effect transistor, wherein the dielectric layer is between the semiconductor substrate and the second semiconductor layer and wherein the second well and at least a portion of the second semiconductor layer are directly opposite each other.

The second well may extend from the first surface into the semiconductor substrate. The second well and the bulk portion form a pn junction.

The second well may laterally extend to some degree beyond an outer circumference of the second field effect transistor but may be absent below other transistors and diodes of the gate driver device. In particular, the second well is laterally separated from other wells associated with other transistors, diodes, and voltage termination regions.

The second semiconductor layer may be a layer of uniform thickness. The thickness of the second semiconductor layer along the vertical direction is in a range from 20 nm to 200 nm, e.g. about 100 nm. The second semiconductor layer and the first semiconductor layer may have the same thickness.

The doped regions of the second field effect transistor may include a source region, a body region, a drift region, and a drain region. The source region, the body region, the drift region and the drain region of the second field effect transistor may be formed side-by-side in this order along one of the horizontal directions, e.g., along the x-axis or along the y-axis.

A gate dielectric formed at the front side of the second semiconductor layer separates the body region from a gate electrode of the second field effect transistor. The dielectric layer and the gate dielectric of the second field effect transistor differ in at least one of material, composition and thickness. In particular, a capacitive coupling between the gate electrode of the second field effect transistor and the second semiconductor layer is greater than a capacitive coupling between the second semiconductor layer and the semiconductor substrate.

The first and second wells associated with the same buffer stage may be spatially separated from each other and may be electrically connectable to different electric potentials at the same point in time. Alternatively, the first and second wells associated with the same buffer stage may laterally merge and may be directly adjoining portions of a single well.

According to an embodiment, the gate driver circuit may include a second driver circuit, wherein an output of the second driver circuit is electrically connected with the second well.

The second driver circuit may be formed in a further semiconductor layer vertically separated from the semiconductor substrate. The second driver circuit may provide a second backgate drive signal to the second well.

According to an embodiment, the second semiconductor layer may include a drift region of the second field effect transistor, wherein the second well and at least a portion of the drift region of the second field effect transistor are directly opposite each other.

The second well and the drift region of the second field effect transistor extend along opposite sides of the dielectric structure with the second well overlapping with at least a portion of the drift region in the lateral direction. A vertical projection of the second well into the first semiconductor layer overlaps with at least a portion of the drift region of the second field effect transistor. In particular, the entire drift region of the second field effect transistor may be directly opposite the second well.

The second well may be absent opposite side the body region of the second field effect transistor. Alternatively, the second well may be formed directly opposite the entire drift region and a directly adjoining portion of the body region of the second field effect transistor. For example, the second well may be directly opposite the entire drift region and the entire body region of the second field effect transistor. According to another example, the second well may be formed such that the entire second semiconductor layer—separated by the dielectric structure—is directly above the second well.

According to an embodiment, the first field effect transistor and the second field effect transistor may have complementary channel types.

In particular, the body regions of the first and second field effect transistors may have complementary conductivity types. The active voltage level of the second backgate drive signal applied to the second well may be inverted with respect to the active voltage level of the first backgate drive signal applied to the first well.

For example, the first field effect transistor is an nFET and the second field effect transistor is a pFET. Alternatively, the first field effect transistor is a pFET and the second field effect transistor is an nFET.

According to an embodiment, the first field effect transistor may include a first gate electrode and a first gate dielectric separating the first gate electrode and the first semiconductor layer, wherein a breakdown strength of the dielectric layer is at least twice as high as a breakdown strength of the first gate dielectric.

For example, the breakdown strength of the dielectric layer may be at least five times or at least ten times as high as the breakdown strength of the first gate dielectric.

If applicable, the second field effect transistor may include a second gate electrode and a second gate dielectric separating the second gate electrode and the second semiconductor layer, wherein a breakdown strength of the dielectric layer is at least twice as high, e.g. at least five times or at least ten times as high as a breakdown strength of the second gate dielectric.

According to a further embodiment a gate driver circuit includes a semiconductor substrate comprising a bulk portion, a first well and a second well, wherein a conductivity type of the first well and the second well is opposite to a conductivity type of the bulk portion, and wherein the first well and the second well may be electrically separated or electrically connected.

The gate driver circuit further includes a first semiconductor layer and a second semiconductor layer, wherein the first semiconductor layer includes doped regions of an n channel field effect transistor and wherein the second semiconductor layer includes doped regions of a p channel field effect transistor.

The gate driver circuit further includes a dielectric layer between the semiconductor substrate at one side and the first and second semiconductor layers at the other side, wherein the first well and at least a portion of the first semiconductor layer are directly opposite each other and wherein the second well and at least a portion of the second semiconductor layer are directly opposite each other.

The gate driver circuit further includes a first driver circuit and a second driver circuit, wherein an output of the first driver circuit is electrically connected with the first well wherein an output of the second driver circuit is electrically connected with the second well.

FIG. 1 shows a gate driver device 500 with a first field effect transistor TR1 and a first driver circuit 410. A load path of the first field effect transistor TR1 is electrically connected between a switching node and a reference potential line. The switching node may be electrically connected to a gate signal output terminal for a gate drive signal and has the switched potential V1. The reference potential line has a reference potential VREF. A first gate signal VG1 is supplied to the first gate electrode GE1. The first driver circuit 410 provides a first backgate drive signal VBG1 to the first backgate structure BG1.

The first backgate drive signal VBG1 is a voltage signal that changes between at least two voltage levels. For example, the first backgate drive signal VBG1 may be a square-wave voltage signal changing between a high level and a low level, wherein the first driver circuit 410 supplies and sinks the required current to drive the different signal levels.

Figure 2A:
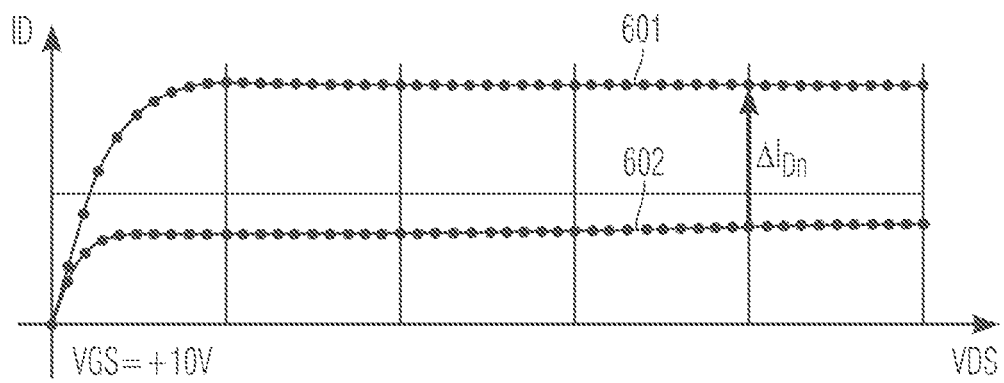
FIGS. 2A and 2B are simplified diagrams showing the saturation currents of output transistors of a gate driver circuit for illustrating effects of the embodiments.

FIG. 2A refers to output characteristics of an SOI nMOSFET with drift region and a blocking voltage capability of 30V, wherein the doped regions of the SOI MOSFET are formed in an isolated semiconductor layer. A 400 nm thick dielectric layer of silicon oxide separates the isolated semiconductor layer from a semiconductor substrate. A backgate structure is formed in a portion of the semiconductor substrate opposite to the drift region in the isolated semiconductor layer.

Line 602 shows the drain current ID of the SOI nMOSFET as a function of the drain-to-source voltage VDS for a gate-to-source voltage VGS of +10V (VGS=+10V) in case the backgate structure is electrically connected to the source of the SOI MOSFET (VBGS=0V). Line 601 shows the drain current in case a backgate voltage VBGS of +10V is supplied to the backgate structure (VBGS=+10V). A backgate voltage VBS of +10V increases the saturation current by ΔIDn, wherein ΔIDn is about 40% of the saturation current for VBGS=0V.

Figure 2B:
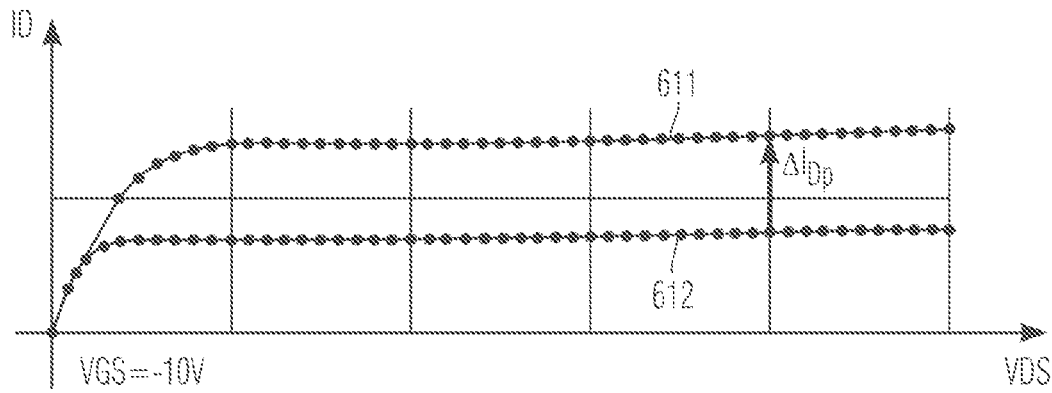

FIG. 2B refers to an analogous SOI pMOSFET with drift region. Line 612 shows the drain current ID of the SOI pMOSFET as a function of the drain-to-source voltage VDS for a gate-to-source voltage VGS of −10V (VGS=−10V) in case the backgate structure is electrically connected to the source of the SOI MOSFET (VBGS=0V). Line 611 shows the drain current in case a backgate voltage VBGS of −10V is supplied to the backgate structure (VBGS=−10V). A backgate voltage VBGS of −10V increases the saturation current by ΔIDp, wherein ΔIDp is about 28% of the saturation current for VBG=0V.

Figure 3:
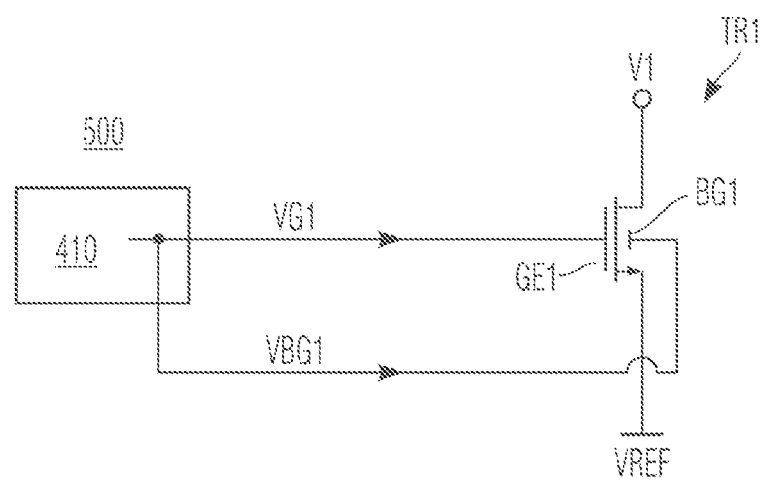
FIG. 3 is a schematic circuit diagram of a gate driver device according to an embodiment with the backgate drive signal branched off from the gate signal.

In FIG. 3 the first driver circuit 410 supplies the first backgate drive signal VBG1 to the first backgate structure BG1 and supplies a first gate signal VG1 to the first gate electrode GE1 of the first field effect transistor TR1.

The first driver circuit 410 may be a gate driver circuit generating the first gate signal VG1, wherein the first driver circuit 410 may directly obtain the first backgate drive signal VBG1 from the first gate signal VG1. A single driver circuit output provides both the first gate signal VG1 and the first backgate drive signal VBG1. The first backgate drive signal VBG1 is branched off from the first gate signal VG1.

Figure 4:
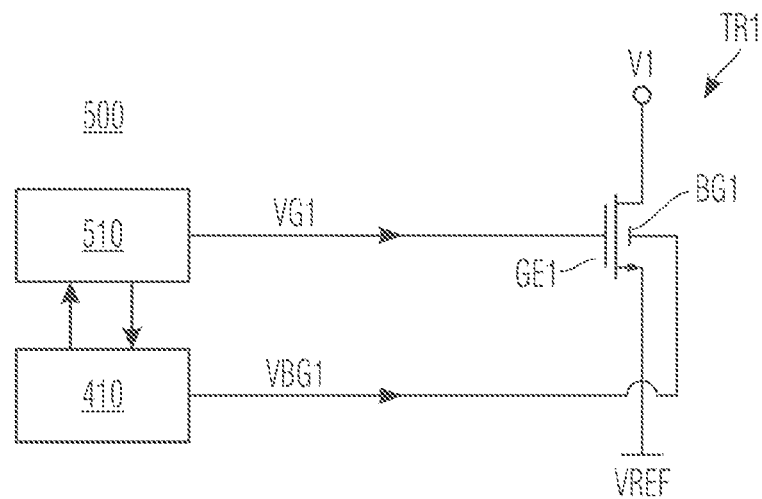
FIG. 4 is a schematic circuit diagram of a gate driver device according to an embodiment with independent gate and backgate drive signals.

In FIG. 4 the gate driver device 500 includes a first gate signal driver circuit 510 in addition to the first driver circuit 410. The first gate signal driver circuit 510 supplies a first gate signal VG1 to the first gate electrode GE1. Level changes of the first backgate drive signal VBG1 and the first gate signal VG1 are in fixed temporal relation to each other.

For example, the level changes of the first backgate drive signal VBG1 and the level changes of the first gate signal VG1 are synchronous or at least approximately synchronous. Alternatively, the level changes of the first backgate drive signal VBG1 may be slightly delayed with respect to the level changes of the first gate signal VG1 by a constant time offset. Alternatively, the level changes of the first gate signal VG1 may be slightly delayed with respect to the level changes of the first backgate drive signal VBG1 by a constant time offset.

Figure 5:
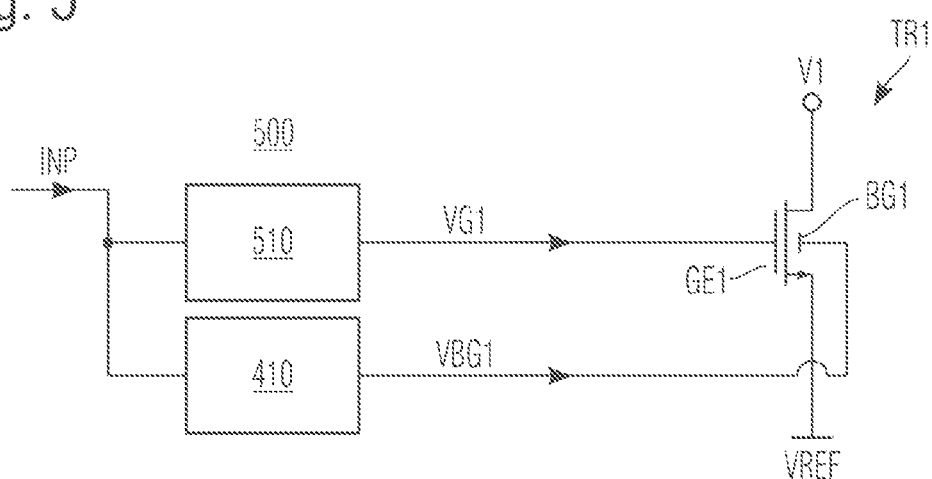
FIG. 5 is a schematic circuit diagram of a gate driver device according to another embodiment with different driver circuits for the gate signal and the backgate drive signal.

In FIG. 5 the first driver circuit 410 and the first gate driver circuit 510 receive a common input signal INP. Rising and/or falling edges of the first gate signal VG1 and the first backgate drive signal VBG1 are in fixed temporal relation with rising and/or falling edges of the common input signal INP.

Figure 6:
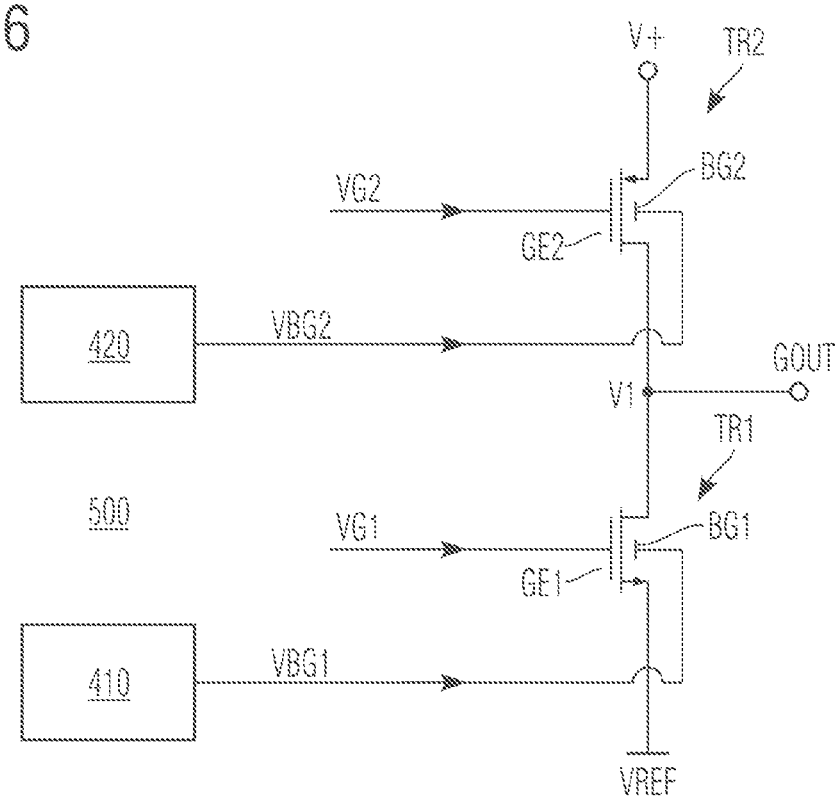
FIG. 6 is a schematic circuit diagram of a gate driver device according to an embodiment related to a buffer stage with two output transistors.

FIG. 6 refers to a gate driver device 500 with two field effect transistors TR1, TR2, wherein the load paths of the two field effect transistors TR1, TR2 are electrically connected in series between a high potential line with a positive supply voltage V+ and the reference voltage line with the reference potential VREF. The first field effect transistor TR1 is an nFET. The second field effect transistor TR1 is a pFET.

The first field effect transistor TR1 with a first gate electrode GE1 and a first backgate structure BG1 is electrically connected between the switched node and the reference voltage line with the reference potential VREF. The switched node is electrically connected to a gate signal output terminal GOUT. The second field effect transistor TR2 with a second gate electrode GE2 and a second backgate structure BG2 is electrically connected between the high potential line and the switched node.

A first driver circuit 410 provides a first backgate drive signal VBG1 to the first backgate structure BG2. The active voltage level of the first backgate drive signal is a positive voltage, the inactive voltage level is 0V or a negative voltage. The second driver circuit 420 provides a second backgate drive signal VBG2 to the second backgate structure BG2. The active voltage level of the second backgate drive signal VBG2 is a negative voltage, the inactive voltage level is 0V or a positive voltage.

Figure 7:
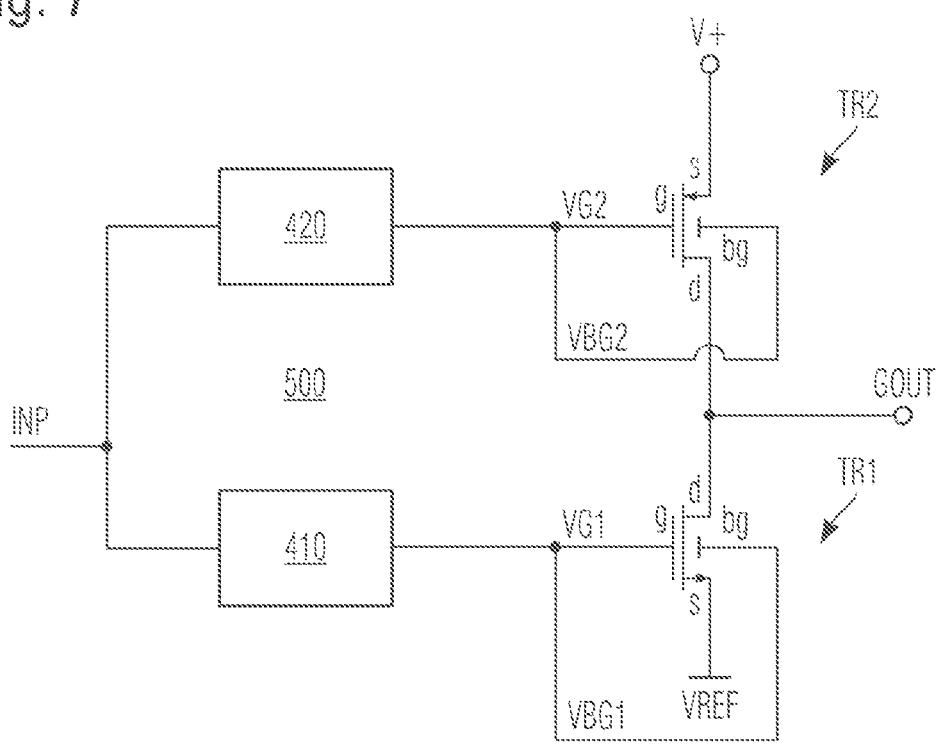
FIG. 7 is a schematic circuit diagram of a gate driver device according to an embodiment related to a buffer stage with two output transistors and with the backgate drive signals branched off from the gate signals.

In FIG. 7 the first driver circuit 410 also provides the first gate signal VG1 to the first gate electrode GE1 of the first field effect transistor TR1. The second driver circuit 420 also provides the second gate signal VG2 to the second gate electrode GE2 of the second field effect transistor TR2. A common input signal INP is provided to the first driver circuit 410 and the second driver circuit 420. Level changes of the first gate signal VG1 and the second gate signal VG2 are in fixed time relation with falling and/or rising edges of the common input signal INP.

Figure 8:
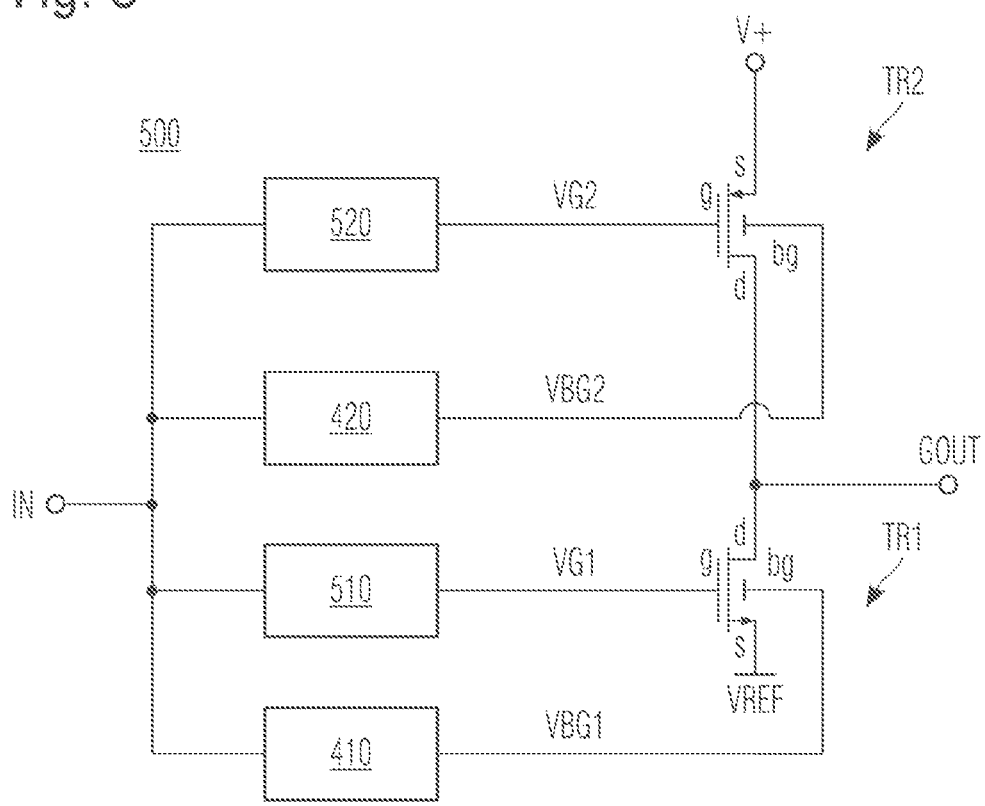
FIG. 8 is a schematic circuit diagram of a gate driver device according to an embodiment related to a buffer stage with two output transistors and with different driver circuits for the gate signals and the backgate drive signals.

In FIG. 8 the gate driver device 500 includes a first gate signal driver circuit 510 in addition to the first driver circuit 410, wherein the first gate signal driver circuit 510 provides the first gate signal VG1 to the first gate electrode GE1 of the first field effect transistor TR1. The gate driver device 500 further includes a second gate signal driver circuit 520 in addition to the second driver circuit 420, wherein the second gate signal driver circuit 520 provides the second gate signal VG2 to the second gate electrode GE2 of the second field effect transistor TR2. Each of the first driver circuit 410, the first gate signal driver circuit 510, the second driver circuit 420, and the second gate signal driver circuit 520 receives a common input signal INP. Level changes of the first gate signal VG1, the second gate signal VG2, the first backgate drive signal VBG1, the second backgate drive signal VBG2 are in fixed time relation with falling and/or rising edges of the common input signal INP.

The first gate signal VG1 and the first backgate drive signal VBG1 may have different active voltage levels. The second gate signal VG2 and the second backgate drive signal VBG2 may have different active voltage levels.

Figure 9A:
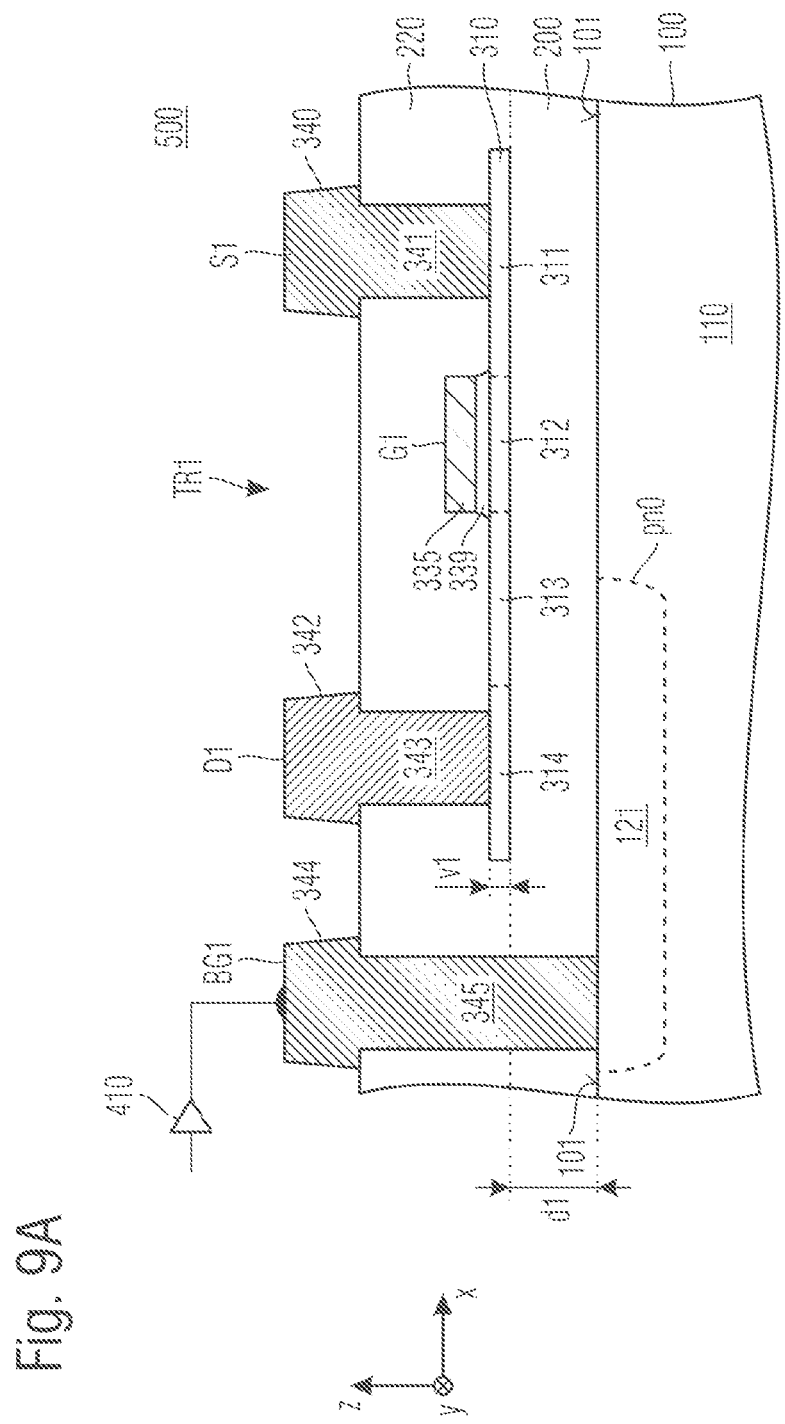
FIG. 9A is a schematic vertical cross-sectional view of an output transistor of a gate driver device according to an embodiment with the backgate structure overlapping only a portion of the transistor drift region.

FIG. 9A shows details of a gate driver circuit 500 in SOI technology. The illustrated part of a SOI composite includes a semiconductor substrate 100, an isolated first semiconductor layer 310 and a dielectric layer 200 that vertically separates the first semiconductor layer 310 from the semiconductor substrate 100.

The semiconductor substrate 100 is from a single crystalline semiconductor material such as silicon and has a first surface 101 at the front side and a second, parallel surface opposite to the first surface 101. A first well 121 extends from the first surface 101 into the semiconductor substrate 100. A bulk portion 110 contains a background doping of the semiconductor substrate 100. The first well 121 and the bulk portion 110 form a pn junction pn0.

The dielectric layer 200 covers the first surface 101. The first semiconductor layer 310 is formed on the dielectric layer 200. The vertical extension v1 of the first semiconductor layer 310 is uniform and may be in a range from 5 nm to 100 nm. The distance d1 between the semiconductor substrate 100 and the first semiconductor layer 310 is uniform and corresponds to the vertical extension of the dielectric layer 200. The distance d1 may be in a range from 200 nm to 800 nm, e.g., from 350 nm to 450 nm. A voltage blocking capability of the dielectric layer 200 may be in a range from 200V to 500V, e.g., about 300V.

The first semiconductor layer 310 includes the doped regions of a first field effect transistor TR1. The doped regions of the first field effect transistor TR1 include a source region 311, a body region 312, a drift region 313, and a drain region 314. The source region 311, the body region 312, the drift region 313 and the drain region 314 are arranged in this order along a horizontal line parallel to the x-axis.

The body region 312 laterally separates the source region 311 and the drift region 313. The drift region 313 laterally separates the body region 312 and the drain region 314. Along the vertical direction, each of the source region 311, the body region 312, the drift region 313 and the drain region 314 extends from the top of the first semiconductor layer 310 down to the bottom of the first semiconductor layer 310. The source region 311, the drain region 314 and the drift region 313 may have a first conductivity type. The body region 312 may have the complementary second conductivity type.

A gate dielectric 339 formed at the front side of the first semiconductor layer 310 separates the body region 312 from a conductive gate electrode 335 of the first field effect transistor TR1. An interlayer dielectric 220 may cover the first semiconductor layer 310, the gate electrode 335 and exposed portions of the dielectric layer 200.

A source contact 341 may extend through an opening in the interlayer dielectric 220 and may electrically connect the source region 311 and a source wiring 340 formed on the interlayer dielectric 220. A drain contact 343 may extend through another opening in the interlayer dielectric 220 and may electrically connect the drain region 314 and a drain wiring 342 formed on the interlayer dielectric 220. A backgate contact 345 may extend through an opening that extends through the interlayer dielectric 220 and the dielectric layer 200. The backgate contact 345 electrically connects the first well 121 with a backgate wiring 344 formed on the interlayer dielectric 220. The output of a first driver circuit 410 is electrically connected to the backgate wiring 344.

In FIG. 9A the first well 121 laterally overlaps with a portion of the drift region 313 oriented to the drain region 314.

Figure 9B:
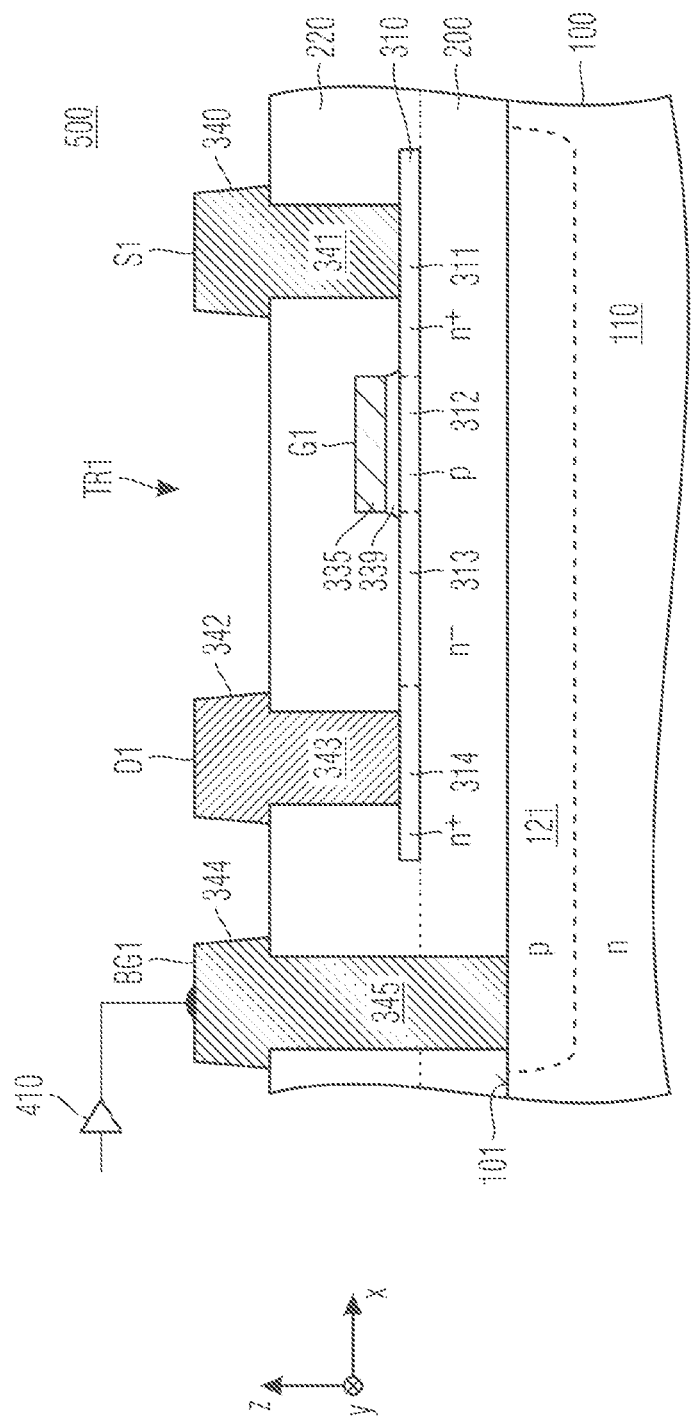
FIG. 9B is a schematic vertical cross-sectional view of an output transistor of a gate driver device according to an embodiment with the backgate structure overlapping the transistor body region.

In FIG. 9B the first well 121 laterally overlaps with the entire drift region 313 and with the entire body region 312. The first well 121 may spare out the source region 311 partly or completely (not illustrated) or may overlap with the entire first semiconductor layer 310 as illustrated.

The first field effect transistor TR1 in FIG. 9B is an nFET with p doped body region 312, lightly n doped drift region 313 and heavily n doped source and drain regions 311, 314.

Each of the embodiments of FIGS. 9A and 9B can be combined with any of the embodiments illustrated in FIG. 1 and FIG. 3 to FIG. 8.

Figure 10:
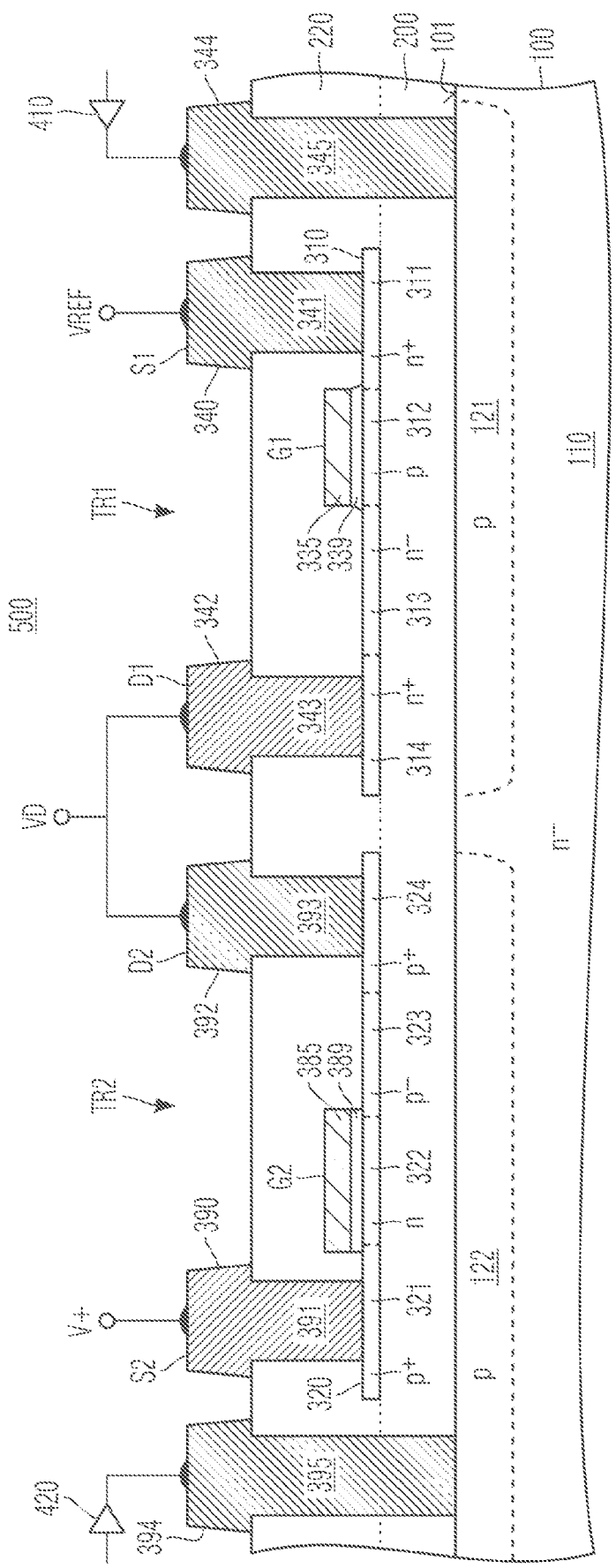
FIG. 10 is a schematic vertical cross-sectional view of a gate driver device buffer stage according to another embodiment.

FIG. 10 shows a gate driver device 500 with an n-channel first field effect transistor TR1 as described in FIG. 9B and a p-channel second field effect transistor TR2, wherein the doped regions of the second field effect transistor TR2 are formed in an isolated second semiconductor layer 320.

The second semiconductor layer 320 includes a heavily p doped source region 321, an n doped body region 322, a lightly p doped drift region 323, and a heavily p doped drain region 324. The source region 321, the body region 322, the drift region 323 and the drain region 324 are arranged in this order along a horizontal line.

The body region 322 laterally separates the source region 321 and the drift region 323. The drift region 323 laterally separates the body region 322 and the drain region 324.

A gate dielectric 389 formed at the front side of the second semiconductor layer 320 separates the body region 322 from a conductive gate electrode 385 of the second field effect transistor TR1. The interlayer dielectric 220 may cover the first semiconductor layer 310, the gate electrode 335 of the first field effect transistor TR1, the second semiconductor layer 320, the gate electrode 385 of the second field effect transistor TR2, and exposed portions of the dielectric layer 200.

A second source contact 391 extends through an opening in the interlayer dielectric 220 and electrically connects the source region 321 and a second source wiring 390 formed on the interlayer dielectric 220. A second drain contact 393 extends through another opening in the interlayer dielectric 220 and electrically connects the drain region 324 and a second drain wiring 392 formed on the interlayer dielectric 220. A second backgate contact 395 may extend through an opening that extends through the interlayer dielectric 220 and the dielectric layer 200. The second backgate contact 395 electrically connects the second well 122 with a second backgate wiring 394 formed on the interlayer dielectric 220. The output of a second driver circuit 420 is electrically connected to the second backgate wiring 394.

The embodiment of FIG. 10 can be combined with any of the embodiments illustrated in FIG. 6, FIG. 7, FIG. 8, FIG. 9A, and FIG. 9B.

Figure 11A:
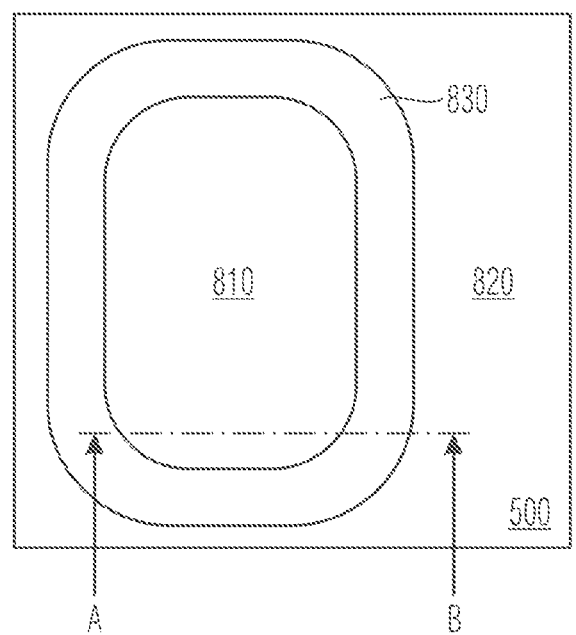

FIGS. 11A and 11B refer to a gate driver device 500 with a first buffer stage 831 for a half-bridge low-side switch and with a second buffer stage 832 for a half-bridge high-side switch according to a further embodiment.

The gate driver device 500 is a half-bridge gate driver device that includes an input portion, a first gate driver portion and a second gate driver portion. The input portion receives an input signal at input terminals. The input signal may include square pulses and may be received from a pulse width modulator circuit. The input portion may pre-process the input signal and may transfer the pre-processed input signal to the first and second gate driver portions, which may be or electrically insulated from the input portion.

The first gate driver portion includes the first buffer stage 831. In response to the received pre-processed input signal, the first gate driver portion generates and drives a first gate signal for a first voltage controlled switching device, e.g., the low-side switch of a half-bridge assembly.

The second gate driver portion includes the second buffer stage 832. In response to the received pre-processed input signal, the second gate driver portion generates and drives a second gate signal for a second voltage controlled switching device, e.g., the high-side switch of a half-bridge assembly.

The first buffer stage 831 includes a first field effect transistor TR1 and a second field effect transistor TR2 as described above and the second buffer stage 832 includes a first field effect transistor TR1 and a second field effect transistor TR2 as described above.

The first and the second buffer stages 831, 832 may be formed in a transition portion 830 laterally separating a first device part 810 and a second device part 820, wherein one of the first and second device parts 810, 820 may include a high-voltage section. In the illustrated embodiment, the first device part 810 includes inter alia a HV-nMOSFET 811 and a reverse diode 812. The second device part 820 may include inter alia an outer termination structure 821.

Below the HV-nMOSFET 811 and below further transistors and diodes in the first device part 810 and the second device part 820, further p doped wells 128 may extend from the first surface 101 into the semiconductor substrate 100. The first and second wells 121, 122 of the first and second buffer stages 831, 831 are spatially and electrically separated from the further p doped wells 128.

The first and second wells 121, 122 of the first buffer stage 831 may merge and the first and second wells 121, 122 of the second buffer stage 832 may merge (not illustrated). In the illustrated embodiment, the first and second wells 121, 122 of the first buffer stage 831 are electrically and spatially separated and the first and second wells 121, 122 of the second buffer stage 832 are electrically and spatially separated.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A gate driver device, comprising:
 a first field effect transistor comprising a first gate electrode and a first backgate structure; and
 a first driver circuit configured to supply a first backgate drive signal to the first backgate structure,
 wherein the first backgate structure comprises a first well formed in a semiconductor substrate,
 wherein a conductivity type of the first well is opposite to a conductivity type of a bulk portion of the semiconductor substrate,
 wherein doped regions of the first field effect transistor are formed in a first semiconductor layer,
 wherein a dielectric layer is formed between the semiconductor substrate and the first semiconductor layer, and
 wherein the first driver circuit is configured to supply the first backgate drive signal to the first well.

2. The gate driver device of claim 1, wherein the first driver circuit is further configured to supply a first gate signal to the first gate electrode.

3. The gate driver device of claim 1, further comprising:
a first gate signal driver circuit configured to supply a first gate signal to the first gate electrode, wherein level changes of the first backgate drive signal and the first gate signal are in fixed temporal relation.

4. The gate driver device of claim 3, wherein the first driver circuit and the first gate signal driver circuit are configured to receive a common input signal and to generate level changes of the first gate signal and the first backgate drive signal in fixed time relation to level changes of the common input signal.

5. The gate driver device of claim 1, further comprising:
a second field effect transistor comprising a second gate electrode and a second backgate structure;
a second driver circuit configured to supply a second backgate drive signal to the second backgate structure.

6. The gate driver device of claim 5, further comprising:
a second gate signal driver circuit configured to supply a second gate signal to the second gate electrode, wherein level changes of the second backgate drive signal and the second gate signal are in fixed temporal relation.

7. The gate driver circuit of claim 5, wherein the first field effect transistor and the second field effect transistor have complementary channel types.

8. A gate driver circuit, comprising:
a semiconductor substrate that comprises a bulk portion and a first well, wherein a conductivity type of the first well is opposite to a conductivity type of the bulk portion;
a first semiconductor layer comprising doped regions of a first field effect transistor;
a dielectric layer between the semiconductor substrate and the first semiconductor layer, wherein the first well and at least a portion of the first semiconductor layer are directly opposite each other; and
a first driver circuit configured to supply a first backgate drive signal to the first well.

9. The gate driver circuit of claim 8,
wherein the first semiconductor layer comprises a drift region of the first field effect transistor, and
wherein the first well and at least a portion of the drift region are directly opposite each other.

10. The gate driver circuit of claim 8, further comprising:
a second well formed in the semiconductor substrate, wherein a conductivity type of the second well is opposite to a conductivity type of the bulk portion; and
a second semiconductor layer comprising doped regions of a second field effect transistor,
wherein the dielectric layer is between the semiconductor substrate and the second semiconductor layer,
wherein the second well and at least a portion of the second semiconductor layer are directly opposite each other.

11. The gate driver circuit of claim 10, further comprising:
a second driver circuit,
wherein an output of the second driver circuit is electrically connected with the second well.

12. The gate driver circuit of claim 10,
wherein the second semiconductor layer comprises a drift region of the second field effect transistor, and
wherein the second well and at least a portion of the drift region of the second field effect transistor are directly opposite each other.

13. The gate driver circuit of claim 10,
wherein the first field effect transistor and the second field effect transistor have complementary channel types.

14. The gate driver device of claim 10,
wherein the first field effect transistor comprises a first gate electrode and a first gate dielectric separating the first gate electrode and the first semiconductor layer, and
wherein a breakdown strength of the dielectric layer is at least twice as high as a breakdown strength of the first gate dielectric.

15. The gate driver device of claim 1, further comprising:
an interlayer dielectric covering the first semiconductor layer;
a backgate wiring on the interlayer dielectric; and
a backgate contact extending through an opening that extends through the interlayer dielectric and the dielectric layer,
wherein the backgate contact electrically connects the first well with the backgate wiring,
wherein an output of the first driver circuit is electrically connected to the backgate wiring.

16. The gate driver device of claim 1, wherein the doped regions of the first field effect transistor formed in the first semiconductor layer include a source region, a body region, a drift region, and a drain region, and wherein the first well laterally overlaps with a portion of the drift region oriented to the drain region.

17. The gate driver device of claim 1, wherein the doped regions of the first field effect transistor formed in the first semiconductor layer include a source region, a body region, a drift region, and a drain region, and wherein the first well laterally overlaps with the entire drift region and with the entire body region.

18. The gate driver device of claim 1, wherein the first well laterally overlaps with the entire first semiconductor layer.

* * * * *